United States Patent [19]

Gabrielse et al.

[11] Patent Number: 4,974,113
[45] Date of Patent: Nov. 27, 1990

[54] SHIELDING SUPERCONDUCTING SOLENOIDS

[75] Inventors: Gerald S. Gabrielse, Lexington, Mass.; Joseph N. Tan, Cebu City, Philippines

[73] Assignee: President and Fellows of Harvard College, Cambridge, Mass.

[21] Appl. No.: 168,920

[22] Filed: Mar. 16, 1988

[51] Int. Cl.$^5$ ............................................ H01H 47/00
[52] U.S. Cl. .................... 361/141; 335/216; 324/320
[58] Field of Search ................. 361/19, 141; 324/320, 324/322; 335/216

[56] References Cited

U.S. PATENT DOCUMENTS

| 3,818,396 | 6/1974 | Raphael | 361/141 |
| 4,733,189 | 3/1988 | Punchard et al. | 324/320 |

FOREIGN PATENT DOCUMENTS

| 2951018 | 2/1982 | Fed. Rep. of Germany . | |
| 251342 | 1/1988 | United Kingdom | 324/320 |

OTHER PUBLICATIONS

Dutta et al., "High Field Nuclear Magnetometer", Rev. Sci. Instrum. 58 (4), Apr. 1987, 1987 American Institute of Physics, pp. 628–631.

Van Dyck et al., "Variable Magnetic Bottle For Precision Geonium Experiments", Rev. Sci. Instrum. 57 (4), Apr. 1986, 1986 American Institute of Physics, pp. 593–597.

*Primary Examiner*—L. T. Hix
*Assistant Examiner*—David M. Gray
*Attorney, Agent, or Firm*—Fish & Richardson

[57] ABSTRACT

A self-shielding system of closed superconducting circuits shields a specific volume from changes in an external magnetic field in which the circuits are located; the configuration of circuits is chosen so that induced currents in the circuits, arising from magnetic flux conservation for each closed circuit, tend to cancel any change in the external magnetic field. In another aspect, a single closed self-shielding superconducting circuit comprised of more than two circular loops connected in series shields a specific volume from changes in an external magnetic field in which the circuit is located; the configuration of the circuit is chosen so that induced currents in the circuit, arising from magnetic flux conservation for the circuit, tends to cancel any change in the external magnetic field.

26 Claims, 8 Drawing Sheets $$\int_i [B_e + B_i] dA = 0. \tag{1}$$

$$S^{-1} = 1 + \frac{B_i(0,0)}{B_e(0,0)} \tag{2}$$

$$S^{-1} = 1 - \frac{\int_i B_e dA / B_e(0,0)}{\int_i B_i(\rho,z) dA / B_i(0,0)} \tag{3}$$

$$S^{-1} = 1 - \frac{\overline{b_e}}{\overline{b_i}} \tag{4}$$

$$\overline{b_e} = \frac{\int_i B_e dA}{B_e(0,0) \int_i dA} \tag{5}$$

$$\overline{b_i} = \frac{\int_i B_i(\rho,z) dA}{B_i(0,0) \int_i dA} \tag{6}$$

$$S^{-1} = 1 - \frac{1}{\overline{b_i}}. \tag{7}$$

$$B_i(0,0) = g_i I_i, \tag{8}$$

$$\int_i B_i(\rho,z) dA = L_{ii} I_i. \tag{9}$$

$$S^{-1} = 1 - \frac{g_i A_i}{L_{ii}}. \tag{10}$$

$$A_i = \frac{\int_i B_e dA}{B_e(0,0)}, \tag{11}$$

FIG. 2

$$B_i(0,0) = g_i I_i. \tag{13}$$

$$A_i = \int_i dA \tag{14}$$

$$\int_i B_j(\rho, z) dA = L_{ij} I_j. \tag{15}$$

$$S^{-1} = 1 - g^T L^{-1} A, \tag{16}$$

$$g^T L^{-1} A = 1. \tag{17}$$

$$S^{-1} = 1 - \left[\frac{g_1 A_1}{L_1} + \frac{g_2 A_2}{L_2} - \frac{M}{L_1 L_2}(g_2 A_1 + g_1 A_2)\right] \left[1 - \frac{M^2}{L_1 L_2}\right]^{-1} \tag{18}$$

$$V_2 = -L_2 \frac{dI_2}{dt}. \tag{19}$$

$$MI_1 + L_2 I_2 = 0 \tag{20}$$

$$\tilde{I}^T = I^T \Omega. \tag{21}$$

$$g = \Omega \tilde{g}, \tag{22}$$

$$A = \Omega \tilde{A}, \tag{23}$$

$$L = \Omega \tilde{L} \Omega^T \tag{24}$$

FIG.5

SHIELDING SUPERCONDUCTING SOLENOIDS

This invention was made with U.S. Government support under Grant Numbers AFOSR 86-0069, PHY 850-7727 and 60 NANB 5D0573 awarded by the Department of the Air Force, the National Science Foundation and the National Bureau of Standards, respectively. The Government has certain rights in this invention.

BACKGROUND OF THE INVENTION

This invention relates to shielding superconducting solenoids.

In some applications of superconducting solenoids, such as NMR, MRI, and mass spectroscopy of particles in an ion trap, variations in the high (e.g., 6 Tesla) magnetic fields produced within the solenoid must be limited to no more than, for example, 6 nanoTeslas (nT) per hour. This degree of stability is hard to achieve because of the influence of relatively greater fluctuations (e.g., between 10 nT and 10 $\mu$T per hour) of the ambient magnetic field produced by, for example, ionospheric conditions, solar activity, and elevators or subways.

Shielding a high magnetic field solenoid from the ambient magnetic field is impractical using highly permeable metals, like iron, (because they become saturated by the high field), or using type I superconductors, such as lead or niobium (because the high field exceeds the critical field for such materials).

In A. Dutta et al., Rev. Sci. Instruments, volume 58, page 628 (1987), a cylinder of type II superconductor was used to screen ambient magnetic field fluctuations from a very small sized high magnetic field region.

R. S. Van Dyck, Jr. et al., Rev. Sci. Instruments, volume 57, page 593 (1986), describe using two serially connected, concentric, coplanar superconducting loops to impose a tunable gradient on a high magnetic field. The radii of the loops were chosen to minimize the shift of the high magnetic field at the center as the gradient was tuned; Ambient magnetic field fluctuations were expected to be reduced by a factor of ten at the center.

SUMMARY OF THE INVENTION

In general, in one aspect, the invention features a self-shielding system of closed superconducting circuits which shields a specific volume from changes in an external magnetic field in which the circuits are located; the configuration of circuits is chosen so that induced currents in the circuits, arising from magnetic flux conservation for each closed circuit, tend to cancel (preferably cancelling exactly) any change in the external magnetic field.

In another aspect, the invention features a single closed self-shielding superconducting circuit comprised of more than two circular loops connected in series, which shields a specific volume from changes in an external magnetic field in which the circuit is located; the configuration of the circuit is again chosen so that induced currents in the circuit, arising from magnetic flux conservation for the circuit, tends to cancel (preferably cancelling exactly) any change in the external magnetic field.

Preferred embodiments of the invention include the following features. The system is arranged to come as close as desired to satisfying the condition $$g^T L^{-1} A = 1$$

where components of column vector g specify the magnetic field produced in the shielded volume per unit current in a circuit, components of column vector A are effective areas of the circuits referred to the location of the shielded volume and L is the inductance matrix. The shielded volume lies at an arbitrary location with respect to the circuits, and the column vectors g and A are defined with respect to the location of the shielded volume. Each closed superconducting circuit includes one or more solenoids connected in series. The system is arranged to produce an intense magnetic field in the shielded volume with the magnetic field having a high degree of spatial uniformity. In some embodiments there is but a single circuit having a single solenoid connected in a closed loop. In other embodiments there are two solenoids each connected in a closed loop, one within the other. For example, a main solenoid may be used to generate a desired magnetic field, and a second compensating solenoid is located inside (or in other cases outside) the main solenoid. The second solenoid may have two spaced apart segments. The two solenoids are cylindrical and coaxial. Where the external magnetic field changes are relatively small compared to the magnetic field within the shielded volume, then in addition to the circuits which generate the desired magnetic field with a nominal spatial homogeneity in the shielded volume, the system includes one or more additional circuits configured to produce shielding with substantially no distortion of the nominal spatial homogeneity in the shielded volume, or to provide shielding while carrying only current induced by the changing external magnetic field, thereby producing a magnetic field gradient in the volume in response to the changing external magnetic field, the magnetic field gradient producing substantially no distortion of the nominal spatial homogeneity in the volume.

The self-shielded solenoid systems of the invention are relatively straightforward to design. Available solenoids may be modified to achieve the self-shielding advantage while retaining the other benefits of the original design, for example, spatial homogeneity. A variety of configurations are possible. The resulting solenoids are especially useful for mass spectroscopy, NMR, and MRI work.

Other features and advantages of the invention will become apparent from the following description of the preferred embodiments, and from the claims.

DESCRIPTION OF THE PREFERRED EMBODIMENTS

We first briefly describe the drawings.

FIG. 1 is a diagrammatic cross-sectional side view of a superconducting solenoid.

FIG. 2 lists equations for determining the requirements for shielding a solenoid circuit.

FIG. 5 lists equations for determining the requirements for shielding a multiple solenoid system and in a general multiple solenoid, multiple circuit system.

Figure 6:
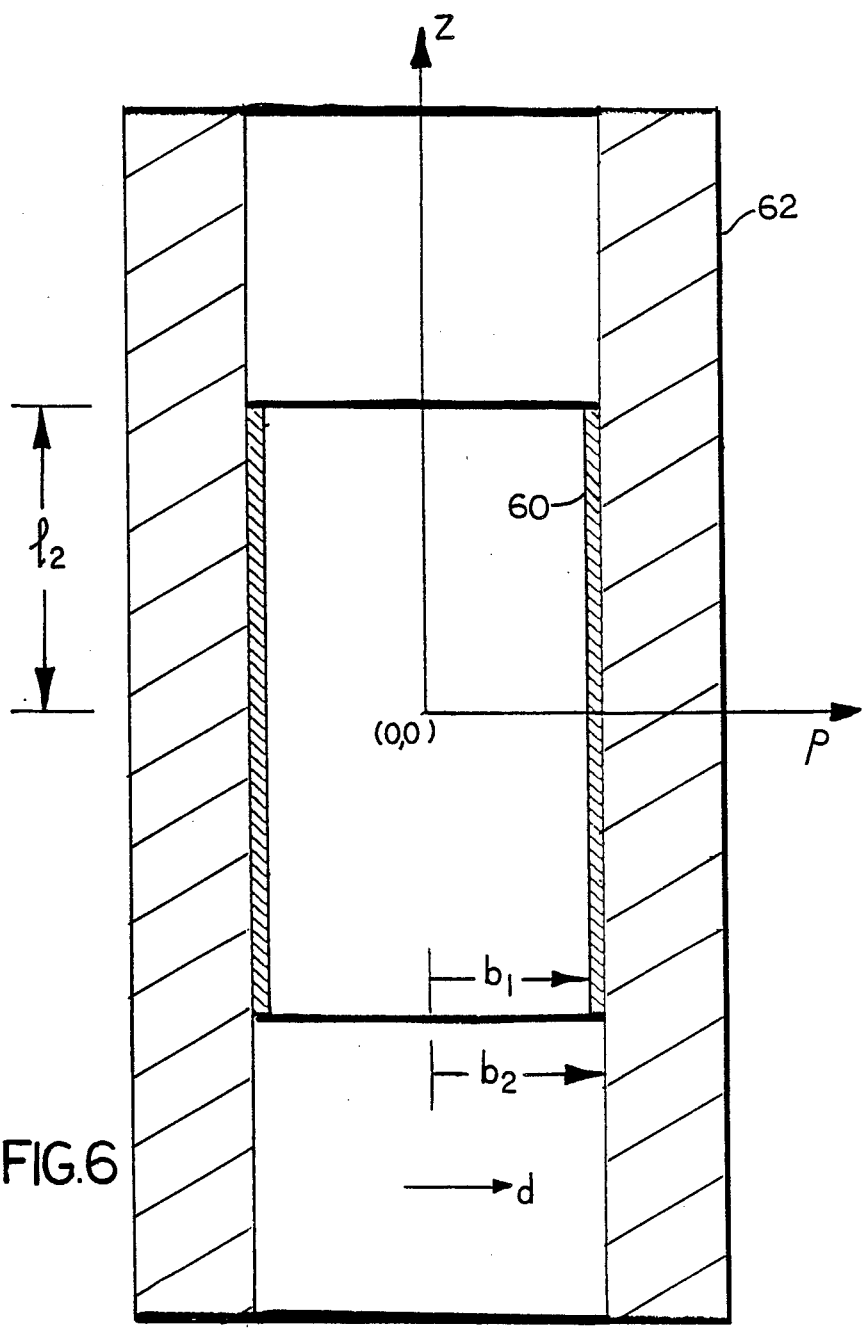
Figure 8:
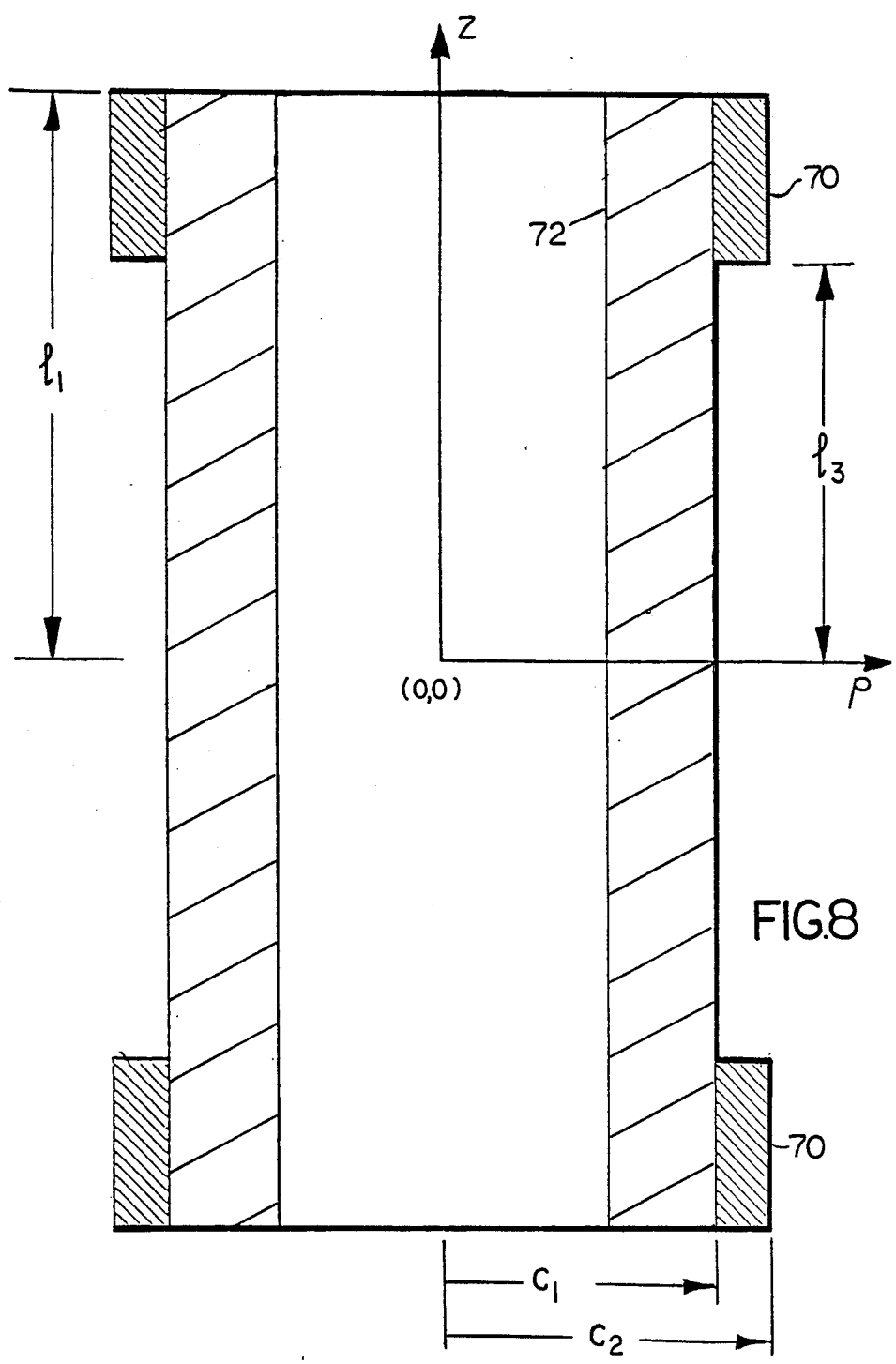

FIGS. 6, 8 are diagrammatic cross-sectional side views of self-shielding two solenoid systems.

Figure 7:
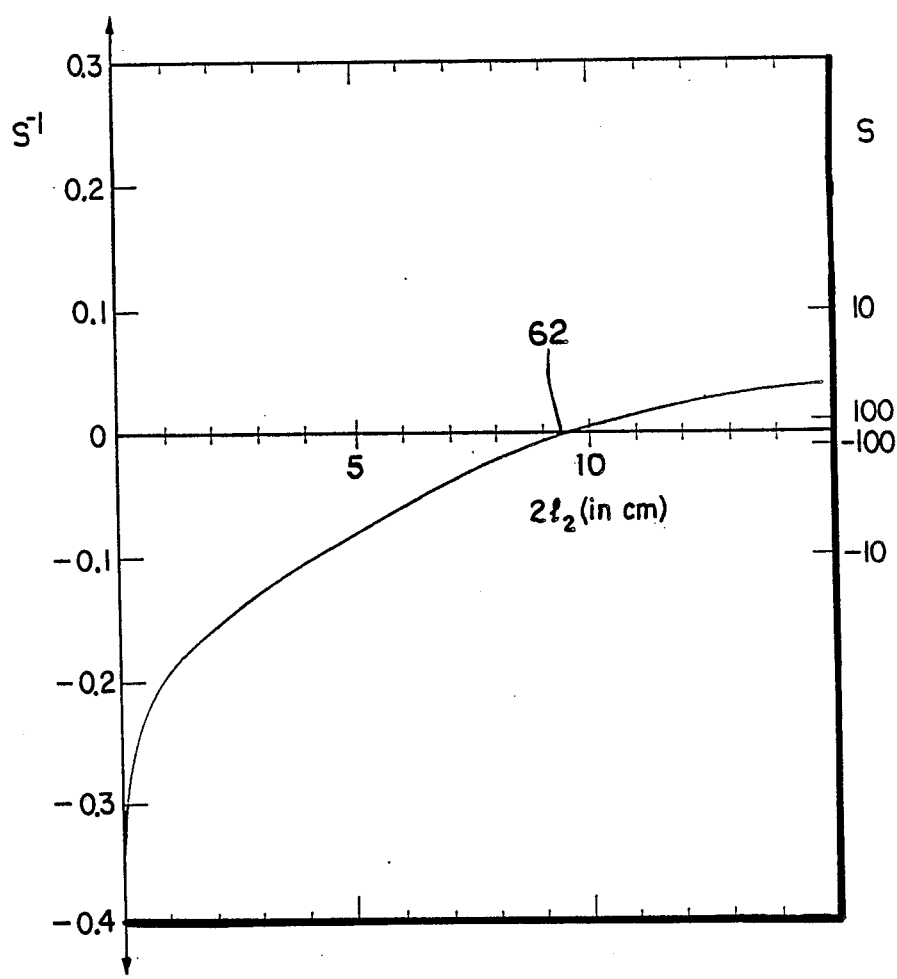

FIG. 7 is a curve relating shielding factor to the length of the inner solenoid of FIG. 6.

STRUCTURE AND OPERATION

Introduction

Many applications require high magnetic fields which are provided by superconducting solenoids. Most common are NMR and MRI (nuclear magnetic resonances and magnetic imaging) applications. Also of interest is the mass spectroscopy of particles in an ion trap using, for example, a 6 Telsa field. For these and other high field applications, it is often desirable that these fields be very stable in time. For example, to compare the masses of a proton and antiproton to a desired precision of 1 part in $10^9$ in a 6 Telsa magnet field requires a time stability better than 6 $\eta$T per hour. Unfortunately, the fluctuations in the ambient field in which the superconducting solenoid is placed varies in this time period from 10 $\eta$T to 10 $\mu$T depending upon ionospheric conditions, solar activity, the proximity to subways and elevators, etc. These fluctuations limit the time stability which can be realized in a high field region, even though the high field solenoid system itself produces a more stable field.

Many techniques are available for shielding out such fluctuations in the presence of small magnetic fields, but it is much more difficult to shield them out of a region of high magnetic field. One reason is that highly permeable materials like iron and "mu metal" are severely saturated and hence useless for shielding within the high-field region. Another is that shields made of type I superconducting materials like lead and niobium cannot be used because the large field is above the critical field for type I superconductors. Finally, a type II superconductor has been used to screen external fluctuations from a very small high-field region, but there was trouble with flux jumps associated with the shield.

In the invention, the external fluctuations are screened using superconducting circuits. As is well known, magnetic flux through a closed superconducting circuit is conserved. For example, coupled superconducting circuits may be configured so that this flux conservation insures that external field fluctuations are screened from a region of interest. In particular, the solenoid systems used to provide the high field can be designed so that they themselves screen out the fluctuations in the ambient field. In simple cases, the superconducting circuits are composed of solenoids which are axially symmetric about a z axis. In general, the z component of the external field $B_e$ is reduced by a shielding factor S to $B_e/S$ and the objective is to make S as large as possible.

A self-shielding solenoid system (a system for which S is large) can be constructed using a wide variety of circuit configurations. Therefore, self-shielding systems can be designed to preserve a variety of other properties. For example, a high degree of spatial homogeneity is often also required in the high-field region in order that very narrow resonance linewidths can be obtained. Time stability is then required to allow measurement of the narrow lines, several hours being required for some mass spectroscopy experiments. The examples of self-shielding solenoid systems discussed below were chosen to suggest ways that such systems can be designed with minimal distortions of the field homogeneity. More complicated solenoid systems may be analyzed in the same way.

The magnetic shielding achieved by the invention applies in principle to external field fluctuations which are arbitrarily fast. Highfield solenoids, however, are typically wound on copper or aluminum cyclinders which readily support eddy currents, especially when cold. External field fluctuations more rapid than 1 Hz typically are already severely screened by the cyclinder.

Single Superconducting Solenoid Circuit

Figure 1:
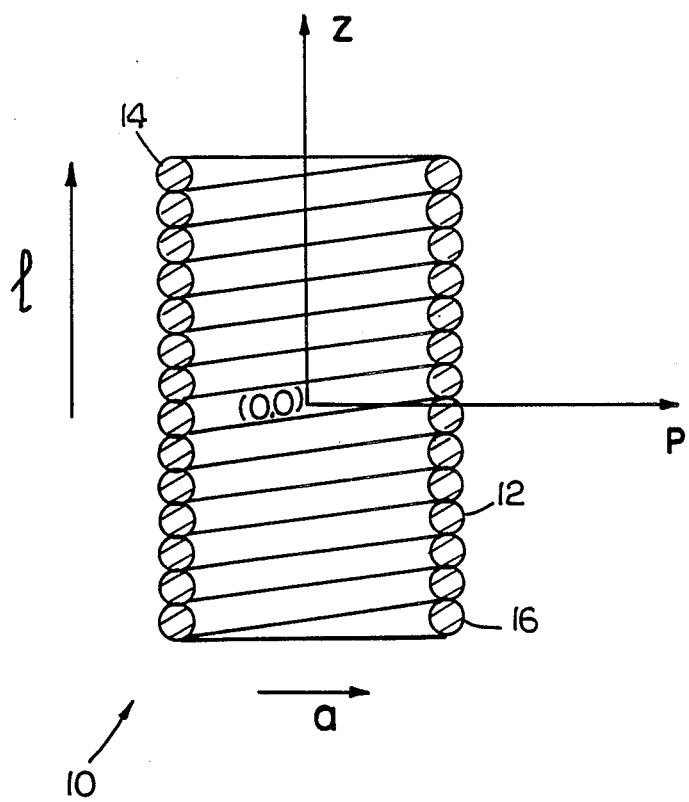

To illustrate the basic shielding scheme, consider a single, axially symmetric solenoid (i). The solenoid 10 shown in FIG. 1 is made of superconducting wire 12 and its ends 14, 16 are connected to make a closed circuit (not shown). The potential difference around the shorted solenoid is zero. Referring also to FIG. 2, by Faraday's law, an externally applied field $B_e$ induces a current $I_i$ in the solenoid which in turn produces a magnetic field $B_i$ sufficient to keep the flux through the solenoid from changing. (Equation 1, FIG. 2). We take the conserved value of the flux to be 0 so that we can focus on fluctuations from some steady state. The subscript on the integral indicates integration over the loop by loop area of the solenoid. The induced current persists since the resistance around the superconducting circuit is zero In what follows, we shall use cylindrical coordinates $\rho$ and z so that $B_i = B_i(\rho,z)$, for example. The net field at the center of the solenoid $B_e(0,0) + B_i(0,0)$ can be written in terms of the shielding factor S as $B_e(0,0)/S$ so that equation 2 of FIG. 2 applies. In light of the flux conservation criterion of equation 1, this can be written as in equation 3 of FIG. 2. To aid intuitive interpretation, note that $S^{-1}$ is linear in the ratio of two averaged fields (equation 4), where the two averaged fields are defined as in equations 5 and 6. Here $\int dA$ is the total area involved in the flux integration for circuit i. Perfect shielding requires a solenoid for which the normalized average values of the external field and solenoid field are equal, $\bar{b}_e = \bar{b}_i$.

Without explicit calculation, one can immediately see that complete shielding of spatially uniform fields is possible with a single superconducting solenoid circuit, even if the solenoid has many layers of windings. For spatially uniform external field $B_e$, we have $\bar{b}_e = 1$ and the shielding is given by equation 7. For a short solenoid, the magnetic field near the windings is larger than the magnetic field near the center. The average value $\bar{b}_i$ is thus greater than 1 so that $S^{-1}$ is positive. For a long solenoid, the average magnetic field produced by the solenoid is slightly less than the field at the center because of the fringing field as its ends. Thus $\bar{b}_i$ approaches 1 from below and $S^{-1}$ approaches 0 from below. Since $S^{-1}$ must cross zero between these two limits, complete shielding is obtained with an appropriate choice of dimensions.

To facilitate explicit calculation, we eliminate the induced current from the expression for the shielding factor using factors $g_i$ and $L_{ii}$ which depend only upon the geometry of the solenoid circuit. The field at the center is proportional to the current (equation 8) as is the flux through the solenoid (equation 9). The latter proportionally factor $L_{ii}$ is the self-inductance for solenoid i. Substituting these two expressions in equation 3 yields equation 10. For a spatially uniform external field, $A_i$ is the total area $\int dA$ used to calculate the flux through circuit i. More generally, $A_i$ is an effective area which depends on the spatial distribution of $B_e$ (equation 11).

Figure 3:
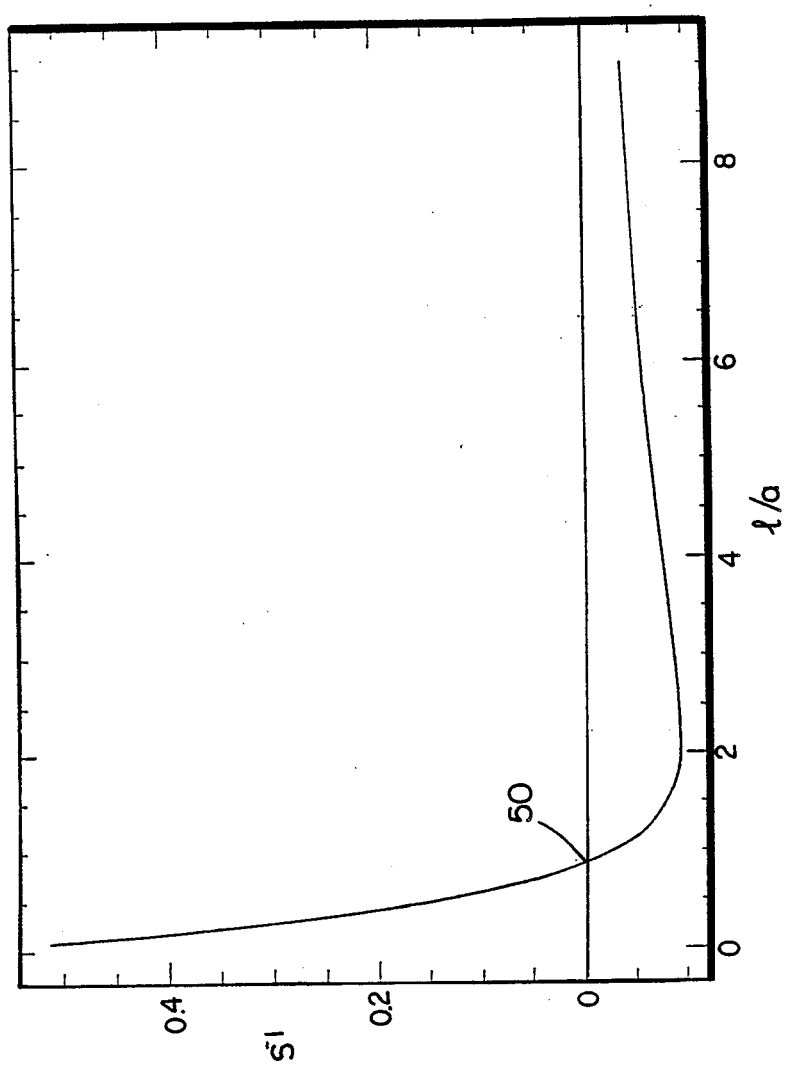
FIG. 3 is a graph relating shielding factor to solenoid aspect ratio.

In FIG. 3, we plot $S^{-1}$ as a function of the solenoid aspect ratio $l/a$ for a single layer, densely wound solenoid. The necessary techniques for calculating inductances are well known (see F. W. Grover, *Inductance Calculations*, (Van Nostrand, N.Y., 1946)) and efficient calculation techniques have been discussed (see M. W. Garrett, J. Appl. Phys. 34, 2567 (1963)). The qualitative features discussed above are readily apparent. The self-shielding is complete (i.e., $S^{-1}=0$) at the aspect ratio $l/a=0.88$ (point 50, FIG. 3) for a densely wound solenoid in the limiting case of vanishing wire diameter.

In general, the shielding produced by a persistent superconducting solenoid is far from complete. To illustrate, we use a solenoid 51 represented in FIG. 4, which is not unlike many high-field solenoids which are commercially available. The large solenoid is wound uniformly with $n_1$ turns and its dimensions and characteristics are given in Table I.

TABLE 1

| | Dimensions | Calculated Parameters |
|---|---|---|
| Basic Solenoid | $a_1 = 7.62$ cm | $L_1 = 232.3$ H |
| | $a_2 = 12.70$ cm | |
| | $A_1 = 2219$ m$^2$ | |
| | $l_1 = 25.40$ cm | |
| | $g_1 = .1469$ T/A | |
| | $n_1 = 64,000$ | |
| | $S = -2.95$ | |

This solenoid would produce a field of 6 T at its center for a reasonable current of approximately 40 A. By itself, we calculate that this solenoid will screen external field fluctuations by a factor of $S = -2.9$, which is typical for commercial superconducting solenoid systems used to produce intense magnetic fields. Improving the self-shielding requires more than a simple reshaping of the solenoid. A self-shielding solenoid of the same radial dimensions, for example, would be reduced in length by more than a factor of 9. Such a squat solenoid would have properties very different from the solenoid in FIG. 4. More practical modifications will be discussed next, involving more than one superconducting circuit.

Coupled Superconducting Circuits

Practical solenoid systems typically contain several circuits, one to produce the large field in a volume of interest within the system, and the others as shims to make the field near the center as homogeneous as possible. We therefore generalize to a system of N closed superconducting circuits, each of which is axially symmetric. The subscript i now becomes an index $i=1, \ldots, N$ which labels the N circuits. A current $I_i$ in circuit i produces the field $B_i(\rho,z)$. The currents can be represented by a column vector I and a related column vector g relates the field at the center to the currents with components defined as in equation 13, FIG. 5. The areas of the circuits are represented by column vector A with components as in equation 14, which may be generalized for the case of non-uniform $B_e$ as was done in equation 11. The familiar symmetric inductance matrix L has components given by equation 15 of FIG. 5. A diagonal element $L_{ii}$ is the self-inductance associated with circuit i and off-diagonal elements are the mutual inductances between circuits. The shielding factor is then as shown in equation 16 with the superscript T indicating transposition so that $g^T$ is a row vector. For a single circuit, equation 16 reduces immediately to equation 10. Complete shielding occurs under the condition of equation 17. This is the condition for a self-shielding solenoid system.

As an illustration, consider a system of two superconducting circuits. One solenoid circuit is characterized by $L_1$, $A_1$, and $g_1$ and the other by $L_2$, $A_2$, and $g_2$. The mutual inductance between two circuits is M. One circuit could be a commercially constructed NMR solenoid to produce a 6T magnetic field, for example, and the other circuit could be a solenoid added to make a self-shielding system. From equation 16, the shielding factor is given by equation 18. For $M \to 0$, comparison with equation 10 shows that each coil contributes independently to the shielding. In general, however, the mutual inductance significantly modifies the shielding.

Computing $S^{-1}$ is rather involved and lengthy, even in this simple two-circuit system. Many of the needed quantities, however, can be measured. This may be useful when modifications or additions to commercially constructed solenoid systems are contemplated, since their internal designs are often difficult to obtain. The self-inductance $L_2$ can be measured in conventional ways, most easily for a large solenoid by measuring the increase of current with time for an applied charging potential $V_2$ (equation 19). For two coupled superconducting circuits, the mutual inductance can be measured by introducing a current $I_1$ in circuit 1. A current $I_2$ is induced in the second circuit to conserve flux through circuit 2. Thus M may be determined from equation 20 when $L_2$ is already known. Circuit areas $A_1$ and $A_2$ can be determined by measuring the shielding factor S for each coil individually.

Figure 4:
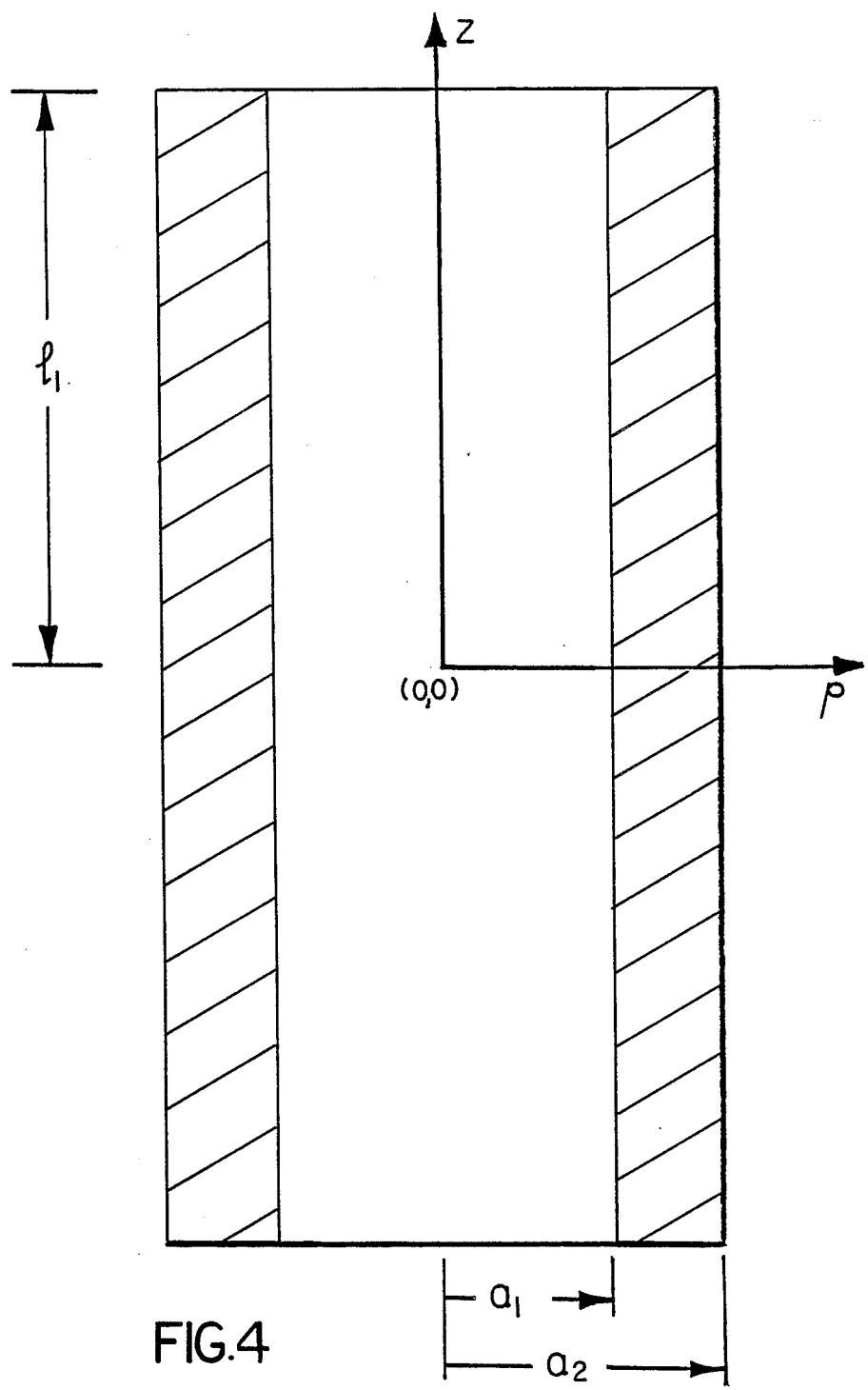
FIG. 4 is a diagrammatic cross-sectional side view of a generalized superconducting solenoid.

For a specific example of a two circuit system, consider in FIG. 6 the addition of a second superconducting solenoid circuit 60 inside the one (circuit 62) shown in FIG. 4. Each solenoid is connected as a separate closed circuit. The added inner solenoid is uniformly wound with the same wire as the big solenoid and its radial dimensions are shown in Table II, section (a).

TABLE II

| | Dimensions | Calculated Parameters |
|---|---|---|
| (a) Inner Solenoid | $b_1 = 6.99$ cm | |
| | $b_2 = 7.62$ cm | |
| (b) Inner Solenoid for Complete Shielding | $l_2 = 4.92$ cm | $L_2 = 0.2931$ H |
| | $n_2 = 1550$ | $M = 3.839$ H$_2$ |
| | | $A_2 = 25.98$ m$^2$ |
| | | $g_2 = 1.106 \times 10^{-2}$ T/A |

Its inductance, area and g values will change as a function of its length in a calculable way, as will the mutual inductance between the two solenoid circuits. Correspondingly, $S^{-1}$ for the composite system changes with the length ($2l_2$) of the inner solenoid as shown in FIG. 7. Ideal self-shielding $S^{-1}=0$ occurs at $2l_2=9.8$ cm in this example (point 62, FIG. 7). Characteristics of the inner solenoid for complete self-shielding are shown in Table II, section (b). This shielding configuration may be used even inside existing solenoid systems whose internal geometries are not well known. Probably the easiest approach in practice is to measure the shielding for inner solenoids of various lengths and then interpolate to determine the appropriate length for complete self-shielding.

An alternative way of constructing a two-circuit self-shielding system is shown in FIG 8. Here a second solenoid circuit 70 is added in two segments on the outside of the basic solenoid 72 of FIG. 4. Since only small correction fields must be produced by the additional solenoid, it can be located relatively far from the central, high-field region. An advantage of this second configuration is that the bore of the magnet remains open for experimental apparatus and the additional coil to produce self-shielding can be added to an existing system. The properties of the added exterior solenoid are listed in Table III.

TABLE III

|  | Dimensions | Calculated Parameters |
|---|---|---|
| (a) Outer Solenoid | $c_1$ = 12.70 cm |  |
|  | $c_2$ = 15.24 cm |  |
| (b) Outer Solenoid for Complete Shielding | $l_3$ = 17.87 cm $n_3$ = 9520 | $L_3$ = 15.58 H $M$ = 31.59 H $A_3$ = 582.8 m$^2$ $g_3$ = 6.978 × 10$^{-3}$ T/A |

Solenoid Circuits

In practical solenoid systems, each of N closed superconducting circuits is formed by connecting a subset of $\tilde{N}$ solenoids in series, with $\tilde{N} \geq N$. Since each solenoid can have a different geometry and current density, we have found it very convenient to first calculate column vectors (g′, A′) and an inductance matrix (L′) for the solenoids. These are defined analogously to their circuit counterparts (g, A and L), which in turn can be obtained by a simple contraction. To accomplish this, an $N \times \tilde{N}$ matrix $\Omega$ is defined such that the currents in the solenoids and circuits, $\tilde{I}$ and I, are related by equation 21. In simple cases where solenoids are connected in series with their currents flowing in the same rotational sense about the z axis, we have $\Omega_{ik}=1$ if circuit i includes solenoid k and $\Omega_{ik}=0$ otherwise. Negative elements may be used to represent currents flowing with opposite helicity with respect to the z axis. The resulting transformation rules are set forth as equations 22, 23, and 24. The screening is determined by using the contracted values of equations 22-24 in equation 16.

We have analyzed in detail a commercial NMR solenoid system (Nalorac 6.0/100/118) which involves 2 superconducting circuits with several solenoids making up each circuit. This system has a calculated shielding factor of $S=-4.45 \pm 0.10$ which agrees with the measured value. The uncertainty reflects some imprecision in our knowledge of the location of the windings and inaccuracy in our inductance calculation. We have studied, moreover, the possibility of adding a simple inner solenoid circuit, in the spirit of the example shown in FIG. 6, to make the solenoid system self-shielding.

Finally, we note that this approach is related to a technique wherein two concentric, coplanar superconducting loops were used to make a tunable gradient in a large magnetic field. The two loops were connected in series such that the current flowed in the same direction. The radii of the loops were chosen to minimize the shift of the magnetic field at the center of the loops which occurred when the gradient was tuned. Accordingly, external field fluctuations were expected to cancel by perhaps a factor of 10 at the center of the loops, albeit at the expense of changing the field gradient. This configuration is not generally useful for shielding because of the gradients introduced. Still, it could be analyzed by treating each loop as a "solenoid", with the two loops connected in series to form a circuit. A complete analysis would also include the mutual inductances between these loops and the superconducting solenoid used to produce the large magnetic field being stabilized.

Spatial Field Homogeneity

It is extremely important that modifications to make a high-homogeneity solenoid system self-shielding do not spoil the spatial homogeneity. Fortunately, the condition for a self-shielding system in equation 16 allows for many possible self-shielding configurations. The approach taken in FIGS. 6 and 8 has minimal effect on field homogeneity. The basic solenoid, optimized to provide the desired level of homogeneity, is left unchanged. A separate additional solenoid is added which would carry no current if the ambient field was stable. Since it only carries the very small current required to cancel out the changes in the external field, it produces only a small field gradient. Suppose, for example, that fluctuations of the ambient field $B_e$ as large as 6 $\mu$T are encountered. This means that the added solenoid at most must produce a field which is 10$^{-6}$ of the 6 T field produced by the system used for mass spectroscopy. The fractional homogeneity requirement on the center solenoid is thus reduced by this factor. For the inner solenoid in FIG. 6, the field at a distance d from the center varies from the field at the center by $(d/l)^2$ which is approximately 10$^{-2}$ so that a homogeneity of 10$^{-8}$ over a sphere 1 cm in diameter would not be compromised by the addition of such a coil. This homogeneity is comparable to that produced by the unmodified solenoid system. Either the inner solenoid of FIG. 6 or the outer solenoid of FIG. 8 could be shaped to improve the homogeneity further, if this were required.

Spatial homogeneity is also important when shielding factors are being measured. For example, we applied an external field to a Nalorac Solenoid system to measure the shielding using a pair of square solenoids with side length of 2 meters. The coils were separated by 2 meters rather than being in a Helmholtz configuration. Even with these large coils, we calculate that the spatial inhomgeneity in the applied external field over the volume of the solenoid system reduces the shielding from $S=-4.45$ in equation 28 to $S=-4.10$ which is what agrees with our measurements. To calculate this reduction it is necessary to use the generalized definition of effective areas shown in equation 11 taking $B_e$ to be the nonuniform field of the external coils.

Spatial uniformity of the fluctuating ambient field over the solenoid system is essential to attain complete self-shielding for the configurations of the examples discussed above. There are cases, however, where it is possible to shield the high-field region from a changing magnetic field which is not uniform over the shielding coil For example, the highest magnetic fields are produced using multi-strand superconducting wire. Solenoids so constructed often are not completely persistent but have a field which decays in time very slowly. If the spatial distribution of this decaying field is known near the center, it may be taken as $B_e$ and used to calculate the effective area of a small, single-strand superconducting coil located near the center. The dimensions of this interior coil are then suitably chosen to compensate the drift in the field.

Other embodiments are within the following claims.

We claim:

1. A system which shields a specific location within the system from the effect of changes in an external magnetic field in which the system is located, the system comprising a plurality of closed superconducting circuits structured to have values of g, L, and A at said location such that $1-g^T L^{-1} A$ is in the vicinity of a point at which $(1-g^T L^{-1} A)$ crosses zero, and such that the value of $\uparrow 1-g^T L^{-1} A \uparrow$ is no greater than (1/5) where components of column vector g specify the magnetic field produced at said shielded location per unit current in a circuit, components of column vector A are effective areas of the circuits referred to said shielded location, and L is the inductance matrix.

2. A self-shielding system for shielding a specific location within the system from the effect of changes in an external magnetic field in which the system is located, the system comprising
a single closed superconducting circuit including more than two loops connected in series, said circuit structured to have values of g, L, and A at said location such that $(1-g^T L^{-1} A)$ is in the vicinity of a point at which $(1-g^T L^{-1} A)$ crosses zero, and such that the value of $\uparrow 1-g^T L^{-1} A \uparrow$ is no greater than (1/5) where components of column vector g specify the magnetic field produced at said shielded location per unit current in a circuit, components of column vector A are effective areas of the circuit referred to said shielded location, and L is the inductance matrix.

3. The system of claim 1 wherein the shielded location is arbitrarily located.

4. The system of claims 1 or 2 wherein each said closed superconducting circuit comprises one or more solenoids connected in series.

5. The system of claim 3 wherein each said closed superconducting circuit comprises one or more solenoids connected in series.

6. The system of claims 1 or 2 arranged to produce an intense magnetic field at the shielded location.

7. The system of claim 3 arranged to produce an intense magnetic field at the shielded location.

8. The system of claim 4 arranged to produce an intense magnetic field at the shielded location.

9. The system of claim 8 also arranged to produce simultaneously at the shielded location a magnetic field with a high degree of spatial uniformity.

10. The system of claim 4 wherein there are two said solenoids each connected in a closed loop, one within the other.

11. The system of claim 10 comprising a main solenoid for generating said desired magnetic field, and a second compensating solenoid inside said main solenoid.

12. The system of claim 10 comprising a main solenoid for generating said desired magnetic field, and a second compensating solenoid outside said main solenoid.

13. The system of claim 12 wherein said second solenoid comprises two spaced apart segments.

14. The system of claim 10 wherein said two solenoids are cylindrical and coaxial.

15. The system of claims 1, or 2 wherein said circuit or circuits comprise one or more cylindrical coaxial solenoids.

16. The system of claim 1 wherein at least some of said plurality of circuits are arranged to produce at the shielded location a desired magnetic field having a nominal spatial homogeneity, wherein said external magnetic field changes are relatively small compared to the desired magnetic field at said shielded location, and wherein the system is configured to produce shielding with substantially no distortion of said nominal spatial homogeneity at said location.

17. The system of claim 1 wherein in addition to the circuits generating a desired magnetic field with a nominal spatial homogeneity at said location, said system comprises one or more additional circuits to provide shielding while carrying only current induced by said changing external magnetic field, thereby producing a magnetic field gradient at said location in response to said changing external magnetic field, said magnetic field gradient producing substantially no distortion of the normal spatial homogeneity at said location.

18. The system of claims 1 or 2 wherein said changes in said external magnetic field are exactly cancelled at said shielded location.

19. A self-shielding system for shielding a specific location within the system from the effect of changes in an external magnetic field in which the system is located, the system comprising
a single closed superconducting circuit including more than two loops connected in series, said circuit structured to have values of g, L, and A at said location such that $(1-g^T L^{-1} A)$ is in the vicinity of a point at which $(1-g^T L^{-1} A)$ crosses zero, where components of column vector g specify the magnetic field produced at said shielded location per unit current in the coil, components of column vector A is the effective area of the coil referred to said shielded location, and L is the inductance matrix,
said circuit having an aspect ratio approximately equal to 0.88.

20. The system of claim 11 wherein said two solenoids are cylindrical and coaxial.

21. The system of claim 12 wherein said two solenoids are cylindrical and coaxial.

22. The system of claim 13 wherein said two solenoids are cylindrical and coaxial.

23. A method of making a system of one or more closed superconducting circuits for shielding a specific location within said system from the effect of changes in an external magnetic field, the method comprising:
computing $g^T L^{-1} A$ for said system at the specific location, where components of column vector g specify the magnetic field produced at the specific location per unit current in a circuit, components of column vector A are effective areas of the circuits referred to the specific location, and L is the inductance matrix;
identifying a configuration for which the computed value for $g^T L^{-1} A$ approximately equals 1 and for which $(1-g^T L^{-1} A)$ for said superconducting circuits is in the vicinity of a point at which $(1-g^T L^{-1} A)$ crosses zero; and
assembling said system in accordance with the identified configuration.

24. The method of claim 23 wherein the identified configuration is the configuration for which the computed value for $g^T L^{-1} A$ lies within the range defined by $1 \pm (1/5)$ so as to achieve a shielding factor at the specified location of greater than 5.

25. The method of claim 24 wherein the system comprises one closed superconducting circuit.

26. The method of claim 24 wherein each said closed superconducting circuit comprises one or more solenoids connected in series.

* * * * *

UNITED STATES PATENT AND TRADEMARK OFFICE
CERTIFICATE OF CORRECTION

PATENT NO. : 4,974,113

DATED : November 27, 1990

INVENTOR(S) : Gerald S. Gabrielse, Joseph N Tan

It is certified that error appears in the above-identified patent and that said Letters Patent is hereby corrected as shown below:

Col. 3, line 19; insert --.-- after "etc"

line 68; insert a hyphen between "Highfield" to read as High-field

Col. 5, lines 20-25; TABLE 1 which reads:

|  | Dimensions | Calculated Parameters |
|---|---|---|
| Basic Solenoid<br>$a_2 = 12.70$ cm<br>$1_1^2 = 25.40$ cm<br>$n_1^1 = 64,000$ | $a_1 = 7.62$ cm<br>$A_1^1 = 2219$ m$^2$<br>$g_1^1 = .1469$ T/A<br>$S^1 = 2.95$ | $L_1 = 232.3$ H | to read as follows:

|  | Dimensions | Calculated Parameters |
|---|---|---|
| Basic Solenoid | $a_1 = 7.62$ cm<br>$a_2 = 12.70$ cm<br>$1_1^2 = 25.40$ cm<br>$n_1^1 = 64,000$ | $L_1 = 232.3$ H<br>$A_1^1 = 2219$ m$^2$<br>$g_1 = .1469$ T/A<br>$S^1 = -2.95$ |

UNITED STATES PATENT AND TRADEMARK OFFICE
CERTIFICATE OF CORRECTION

PATENT NO. : 4,974,113

DATED : November 27, 1990

INVENTOR(S) : Gerald S. Gabrielse, Joseph N. Tan

It is certified that error appears in the above-identified patent and that said Letters Patent is hereby corrected as shown below:

Col. 8, line 21; "10-8" should be --$10^{-8}$-- line 47; insert --.-- after "coil"

line 66; "$1 - g^T L-A)$" should be --$(1 - g^T L^{-1} A)$--

Signed and Sealed this

Twenty-seventh Day of October, 1992

Attest:

DOUGLAS B. COMER

Attesting Officer

Acting Commissioner of Patents and Trademarks